(12) United States Patent
Hsu et al.

(10) Patent No.: US 12,726,107 B2
(45) Date of Patent: Sep. 1, 2026

(54) POWER CONVERTER WITH SURGE SUPPRESSION

(71) Applicant: ANPEC ELECTRONICS CORPORATION, Hsinchu (TW)

(72) Inventors: Chun-Kai Hsu, Hsinchu City (TW); Chih-Heng Su, Hsinchu City (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 226 days.

(21) Appl. No.: 18/822,440

(22) Filed: Sep. 2, 2024

(65) Prior Publication Data

US 2025/0392206 A1 Dec. 25, 2025

(30) Foreign Application Priority Data

Jun. 20, 2024 (TW) ................................ 113122801

(51) Int. Cl.
*H02M 3/156* (2006.01)
*H02M 1/32* (2007.01)
*H03K 17/06* (2006.01)

(52) U.S. Cl.
CPC ............ *H02M 1/32* (2013.01); *H02M 3/156* (2013.01); *H03K 17/06* (2013.01); *H03K 2217/0063* (2013.01); *H03K 2217/0072* (2013.01)

(58) Field of Classification Search
CPC ........ H02M 1/32; H02M 3/156; H03K 17/06; H03K 2217/0063; H03K 2217/0072
See application file for complete search history.

(56) References Cited

U.S. PATENT DOCUMENTS 12,451,799 B2 * 10/2025 Chen .................. H02M 1/0009
2026/0018984 A1 * 1/2026 Chen .................. H02M 1/0025

* cited by examiner

*Primary Examiner* — Adolf D Berhane
(74) *Attorney, Agent, or Firm* — Li & Cai Intellectual Property Office

(57) ABSTRACT

A power converter with surge suppression is provided. The power converter includes a high-side switch, a low-side switch, a control circuit, and a discharge circuit. The control circuit connects the high-side switch and the low-side switch, and controls the operation of the high-side switch and the low-side switch. The discharge circuit receives an output voltage drop signal from an external ramp indication circuit. When the output voltage drop signal indicates that the output voltage of an output voltage signal at the output end of the power converter is dropping, the discharge circuit discharges the input voltage source. When the output voltage drop signal indicates that the output voltage has stopped dropping, the discharge circuit stops discharging the input voltage source.

15 Claims, 5 Drawing Sheets

POWER CONVERTER WITH SURGE SUPPRESSION

CROSS-REFERENCE TO RELATED PATENT APPLICATION

This application claims the benefit of priority to Taiwan Patent Application No. 113122801, filed on Jun. 20, 2024. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to power converters, and more particularly to a power converter with surge suppression.

BACKGROUND OF THE DISCLOSURE

Power converters are widely used power supply devices in existing electronic products, and DC/DC power converters mainly convert a DC input voltage into an output voltage suitable for load use. However, as the load increases and transient response requirements become more stringent, the capacitors disposed at the output end of the power converter also increase in size, such that it causes the energy generated when the output voltage signal of the power converter drops to lift the input voltage, thus leading to malfunctioning or even burning out of the circuit components of the power converter.

SUMMARY OF THE DISCLOSURE

In response to the above-referenced technical inadequacies, the present disclosure provides a power converter with surge suppression to address the issues in the relevant art.

The present disclosure provides a power converter with surge suppression, including: a high-side switch, a low-side switch, a control circuit, and a discharge circuit. A first end of the high-side switch is connected to an input voltage source to receive an input voltage. A first end of the low-side switch is connected to a second end of the high-side switch, a second end of the low-side switch is grounded, and a node between the first end of the low-side switch and the second end of the high-side switch is connected to a first end of an inductor. The second end of the inductor is connected to the first end of one or more output capacitors, and the second end of one or more output capacitors is grounded. The node between the second end of the inductor and the first end of one or more output capacitors serves as the output end of the power converter. The control circuit connects the control end of the high-side switch and the control end of the low-side switch and is configured to control the operation of the high-side switch and the low-side switch. The discharge circuit is configured to receive an output voltage drop signal from an external ramp indication circuit, and when the output voltage drop signal indicates that the output voltage at the output end of the power converter is dropping, the discharge circuit discharges the input voltage source. When the output voltage drop signal indicates that the output voltage has stopped dropping, the discharge circuit stops discharging the input voltage source.

In summary, the power converter with surge suppression provided by the present disclosure can quickly discharge the input voltage when the output voltage drops, and stop discharging when the output voltage stops dropping, so that the input voltage can effectively suppress any surges during the discharging and stop-discharging process, thereby ensuring that the electronic components in the power converter can operate normally.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
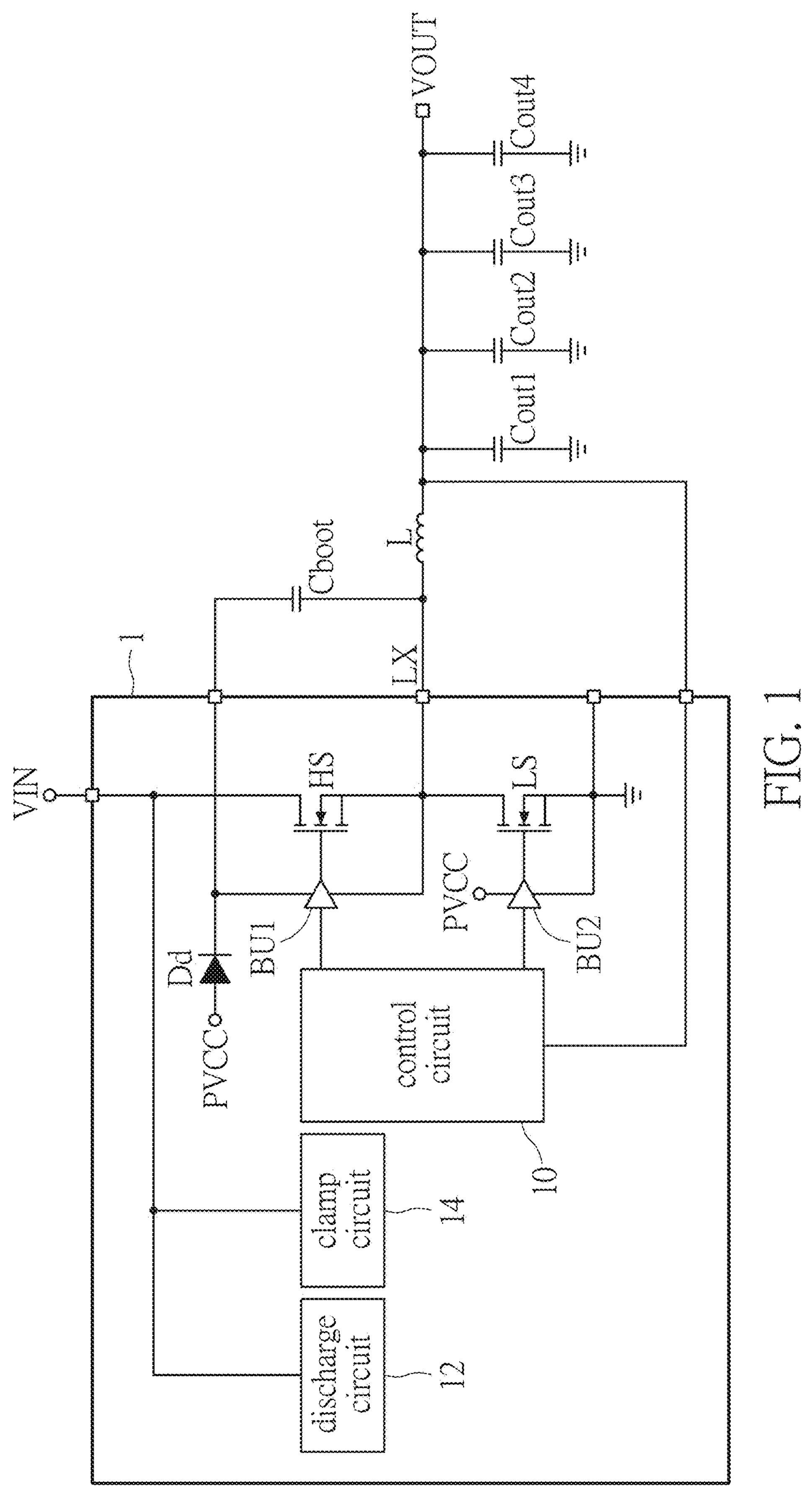
FIG. 1 is a circuit diagram of a power converter provided by an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether or not a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

The present disclosure provides a power converter with surge suppression. The described power converter is specifically for DC/DC power converters and can suppress voltage overshoot caused by voltage ramp-down of the output voltage by determining whether the output voltage of the DC/DC power converter is ramping down. The suppression means involves a discharge circuit that immediately discharges the input voltage when there is an overshoot, thereby reducing the impact of the overshoot voltage on the input voltage and ensuring the normal operation of the electronic components in the power converter.

Embodiment of the Power Converter

Reference is made to FIG. 1, which is a schematic diagram of the system architecture of the power converter provided by the embodiment of the present disclosure. The power converter 1 in this embodiment, for example, includes a high-side switch HS, a low-side switch LS, a control circuit 10, a discharge circuit 12, and a clamp circuit 14. In other embodiments, the power converter 1 can further include other electronic components such as a bootstrap capacitor Cboot, a diode Dd, a high-side buffer BU1, and a low-side buffer BU2.

A first end of the high-side switch HS is connected to an input voltage source to receive an input voltage VIN from the input voltage source. The second end of the high-side switch HS is connected to the first end of the low-side switch LS, and the control end of the high-side switch HS is controlled by the control circuit 10. The second end of the low-side switch LS is grounded, and the node LX between the first end of the low-side switch LS and the second end of the high-side switch HS is connected to the first end of an inductor L. The control end of the low-side switch LS is also controlled by the control circuit 10.

The second end of the inductor L is connected to an energy storage circuit, which may include one or more output capacitors. For example, the first end of each of the output capacitors Cout-Cout4 shown in FIG. 1 is connected to the second end of the inductor L, and the second end of each of the output capacitors Cout1-Cout4 is grounded, but the present disclosure is not limited thereto. The node between the second end of the inductor L and the first end of each of the output capacitors Cout1-Cout4 serves as the output end of the power converter 1, and the output voltage VOUT of the output end is provided for the load. The number of capacitors used in the energy storage circuit can be flexibly set according to the output energy of the power converter 1.

The high-side buffer BU1 is a buffer. The input end of the high-side buffer BU1 is connected to the output end of the control circuit 10. The output end of the high-side buffer BU1 is connected to the control end of the high-side switch HS. The positive power supply end of the high-side buffer BU1 receives a power voltage PVCC input, and the negative power supply end of the high-side buffer BU1 is connected to the second end of the high-side switch HS.

The anode of the diode Dd is coupled to the power voltage PVCC. The cathode of the diode Dd is connected to the positive power supply end of the high-side buffer BU1 and the first end of the bootstrap capacitor Cboot. The second end of the bootstrap capacitor Cboot is connected to the node LX between the first end of the low-side switch LS and the second end of the high-side switch HS, as well as to the first end of the inductor L.

The low-side buffer BU2 is a buffer. The input end of the low-side buffer BU2 is connected to the output end of the control circuit 10. The output end of the low-side buffer BU2 is connected to the control end of the low-side switch LS. The positive power supply end of the low-side buffer BU2 receives the power voltage PVCC, and the negative power supply end of the low-side buffer BU2 is grounded.

The control circuit 10 is connected to the node between the second end of the inductor L and the first end of each of the output capacitors Cout1-Count4 (i.e., the output end of the power converter 1). The control circuit 10 can receive the output voltage VOUT of the power converter 1 from the node between the second end of the inductor L and the first end of each of the output capacitors Cout1-Count4, and can accordingly control the operation of the high-side switch HS and the low-side switch LS based on the output voltage VOUT of the power converter 1.

In one embodiment, the control circuit 10 alternately switches the conduction of the high-side switch HS and the low-side switch LS to control the magnitude of the output voltage VOUT.

For example, when the control circuit 10 turns off the high-side switch HS and turns on the low-side switch LS, part of the output current at the output end of the power converter 1 sequentially flows through the inductor L and the turned-on low-side switch LS to ground. Conversely, when the control circuit 10 turns off the low-side switch LS, another part of the output current flows from the output end of the power converter 1 through the high-side switch HS back to the input voltage source supplying the input voltage VIN, thus causing an overshoot in the input voltage of the input voltage source at this time.

Furthermore, when the control circuit 10 turns off the high-side switch HS and turns on the low-side switch LS for too long, the output voltage VOUT of the power converter 1, which is fed back to the input voltage source supplying the input voltage VIN, will gradually increase excessively, thus potentially causing damage to the input voltage source and the circuit components of the power converter 1, such as the high-side switch HS, due to the overshoot voltage.

Accordingly, in this embodiment, the discharge circuit 12 can suppress the aforementioned overshoot voltage. The suppression method used here is to promptly obtain an output voltage drop signal through the discharge circuit 12 and determine whether to discharge the input voltage source based on the indicated status of the output voltage drop signal.

For example, when the output voltage drop signal indicates that the output voltage VOUT at the output end of the power converter 1 is decreasing, the discharge circuit 12 discharges the input voltage source. When the output voltage drop signal indicates that the output voltage VOUT has stopped decreasing, the discharge circuit 12 stops discharging the input voltage source.

The output voltage signal at the output end of the power converter 1 is received at the node between the second end of the inductor L and the first end of each of the output capacitors Cout1-Cout4, and is the output voltage VOUT of the power converter 1.

In one embodiment, for obtaining the output voltage drop signal, the discharge circuit 12 or the control circuit 10 can receive the output voltage drop signal from an externally connected ramp indication circuit. In this way, it can be determined through the output voltage drop signal whether the output voltage VOUT of the power converter 1 is decreasing.

The output voltage drop signal is used to determine whether a preset voltage ramp-down state has occurred in the waveform of the output voltage signal of the power converter 1, and the external ramp indication circuit can determine the change in this output voltage waveform. For example, when the external ramp indication circuit determines that the change in the output voltage waveform meets the voltage ramp-down condition, it can be recognized that the output voltage VOUT of the power converter 1 is undergoing a transient decrease. Conversely, if the external ramp indication circuit determines that the change in the output voltage waveform does not meet the voltage ramp-down condition, it can be recognized that the output voltage VOUT of the power converter 1 is not undergoing a transient decrease. For instance, when the output voltage VOUT of the power converter 1 generates a voltage ramp-down condition, the output voltage drop signal of the external ramp indication circuit can indicate that the output voltage VOUT of the power converter 1 is decreasing.

It is worth noting that when the discharge circuit 12 discharges the input voltage source, it does so by providing multiple simultaneously conducting discharge paths to discharge the input voltage source. That is, the multiple simultaneously conducting discharge paths can quickly dissipate the energy causing the voltage overshoot of the input voltage VIN of the input voltage source. The discharge circuit 12 extracts the current flowing into the input voltage source through multiple conducting discharge paths to ensure that the input voltage VIN of the input voltage source can be stably maintained at a reasonable supply voltage level, thereby effectively maintaining the normal operation of the electronic components of the power converter 1.

In one embodiment, when the discharge circuit 12 transitions from the discharge state to the stop discharge state, the discharge circuit 12 can selectively control all discharge paths to stop discharging simultaneously or in multiple stages based on the amount of energy causing the voltage overshoot of the input voltage VIN. For example, if stopping all discharge paths simultaneously does not cause a voltage overshoot in the input voltage VIN of the input voltage source, all discharge paths can be allowed to stop discharging simultaneously. Conversely, if stopping all discharge paths simultaneously causes a voltage overshoot in the input voltage VIN of the input voltage source, then all discharge paths will stop discharging in multiple stages.

In one embodiment, stopping all discharge paths in multiple stages means stopping one discharge path at a time until all discharge paths have stopped discharging.

In another embodiment, stopping all discharge paths in multiple stages means stopping two or more discharge paths simultaneously until all discharge paths have stopped discharging.

In yet another embodiment, stopping all discharge paths in multiple stages means stopping at least one discharge path in one instance, and stopping two or more discharge paths simultaneously in other instances, until all discharge paths have stopped discharging.

The clamp circuit 14 is connected to the input voltage source and can provide a different surge suppression mechanism compared to the discharge circuit 12. For example, when the input voltage VIN of the input voltage source exceeds the first voltage threshold of the clamp circuit 14, the clamp circuit 14 activates and clamps the input voltage to the first voltage threshold.

Therefore, the activation conditions of the clamp circuit 14 and the discharge circuit 12 are different. In one embodiment, when the discharge circuit 12 discharges the input voltage source, it can clamp the input voltage to a second voltage threshold. The first voltage threshold is greater than the second voltage threshold, and the second voltage threshold is approximately equal to the input voltage VIN of the input voltage source.

Embodiment of the Discharge Circuit

Figure 2:
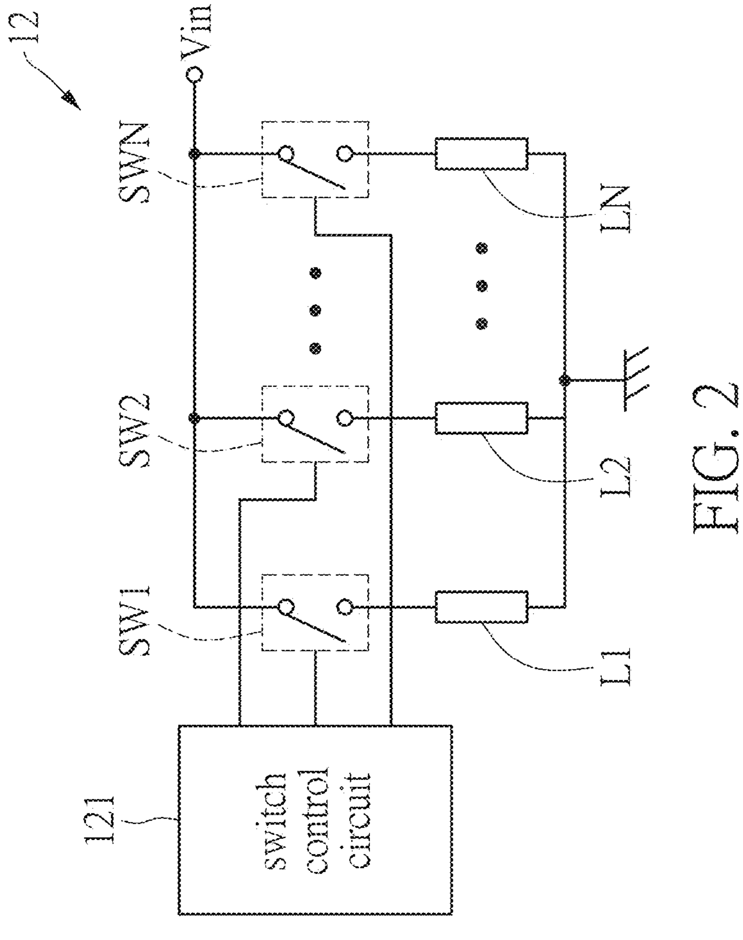
FIG. 2 is a circuit diagram of the discharge circuit provided by an embodiment of the present disclosure.

Reference is made to FIG. 2, which is a circuit diagram of the discharge circuit provided in an embodiment of the present disclosure. The discharge circuit 12 includes a switch control circuit 121, a plurality of switching switches, and a plurality of discharge paths. The number of switching switches corresponds to the number of discharge paths, with each switching switch controlling the conduction or disconnection of a corresponding discharge path. Specifically, the first end of each switching switch is connected to the first end of the high-side switch HS, the second end of each switching switch is connected to the first end of a discharge path, and the second end of each discharge path is grounded. The switch control circuit 121 is individually connected to the control end of each switching switch.

For convenience of description, the plurality of switching switches are denoted as switching switches S1, S2 . . . SN, and the plurality of discharge paths are denoted as discharge paths L1, L2 . . . LN.

Further, the switch control circuit 121 controls the conduction or disconnection of the plurality of switching switches based on the output voltage drop signal. For example, when the switch control circuit 121 receives an output voltage drop signal indicating that the output voltage VOUT is decreasing, it controls the plurality of switching switches to turn on simultaneously. The switch control circuit 121 outputs conduction commands to each switching switch, thereby allowing the input voltage source to discharge through multiple discharge paths.

On the other hand, when the switch control circuit 121 receives an output voltage drop signal indicating that the output voltage VOUT has stopped decreasing, it controls the plurality of switching switches to disconnect in stages. The switch control circuit 121 outputs disconnection commands to the switching switches to be disconnected, and when all the switching switches are disconnected, the discharge circuit 12 stops discharging the input voltage source. In other embodiments, the switch control circuit 121 can also simultaneously shut off the plurality of switching switches based on usage requirements.

It should be noted that when the switch control circuit 121 controls the plurality of switching switches to shut off in stages, at least one switching switch is shut off each time. The switch control circuit 121 sends a shut-off command to one of the already conducting switching switches, and after an interval of time, sends another shut-off command to another conducting switching switch, until all conducting switching switches have received the shut-off command. The conducting switching switch switches from conducting to shut off upon receiving the shut-off command.

In one embodiment, when the switch control circuit 121 receives the output voltage drop signal indicating that the output voltage VOUT has stopped decreasing, the switch control circuit 121 shuts off all switching switches within a preset time range, with the closure of at least one switching switch each time within the preset time range.

For example, when the switch control circuit 121 receives the output voltage drop signal indicating that the output voltage VOUT is decreasing, it outputs a conduction command to each switching switch S1, S2 . . . SN, causing all switching switches S1, S2 . . . SN to turn on. Consequently, discharge paths L1, L2 . . . LN can discharge the input voltage VIN of the input voltage source, thereby effectively drawing the large current caused by the surge from the input voltage VIN through multiple branch discharge paths.

On the other hand, when the switch control circuit 121 receives the output voltage drop signal indicating that the output voltage VOUT has stopped decreasing, it sends shut-off commands to each switching switch S1, S2 . . . SN, thereby causing the switching switches S1, S2 . . . SN to shut off in stages based on the different times they receive the shut-off commands. For example, the switch control circuit 121 outputs a shut-off command to switching switch S1, thereby causing the discharge path L1 to stop discharging, and then outputs a shut-off command to switching switch S2, thereby causing the discharge path L2 to stop discharging, and so on until the last discharge path LN stops discharging.

Embodiment of Controlling the Power Converter

Figure 3:
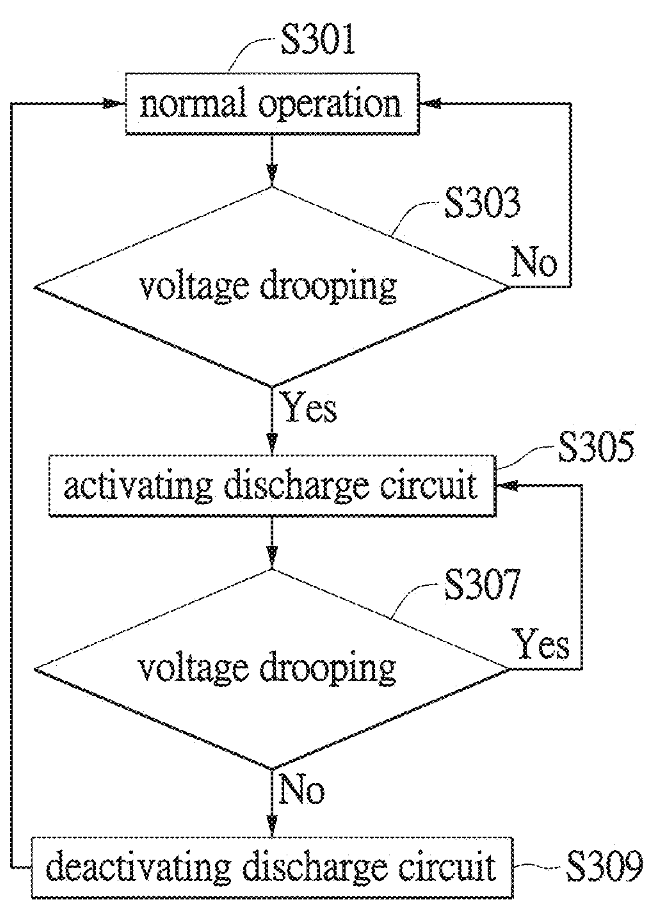
FIG. 3 is a control flowchart of the power converter provided by an embodiment of the present disclosure.

Reference is made to FIG. 3, which is a control flowchart of the power converter provided in an embodiment of the present disclosure. The flow shown in FIG. 3 includes but is not limited to the following steps, and can be referenced in conjunction with the structures shown in FIGS. 1 and 2.

In S301, it is a normal operation. When the power converter 1 provides a stable output voltage VOUT corresponding to the load demand, the power converter 1 is in normal operation, meaning that the discharge circuit 12 is in a non-activated state.

In S303, whether a voltage drop occurs is determined. The discharge circuit 12 determines whether it has received an output voltage drop signal indicating that the output voltage VOUT is decreasing, to know whether the output voltage VOUT of the power converter 1 is undergoing an instantaneous change and whether the input voltage will produce a voltage overshoot. If S303 determines yes, the process proceeds to S305; if S303 determines no, the process returns to S301.

In S305, the discharge circuit 12 is activated. If S303 determines yes, it means that the output voltage VOUT of the power converter 1 has undergone an instantaneous voltage drop change, so that the discharge circuit 12 immediately discharges the input voltage VIN through multiple simultaneously conducting discharge paths to suppress the voltage overshoot of the input voltage VIN.

In S307, whether a voltage drop occurs is determined. Then, whether the voltage drop is still occurs is continued to be determined. If S307 determines yes, the process returns to S305 to continue discharging; if S307 determines no, the process proceeds to S309.

In S309, the discharge circuit 12 is shut off. When the output voltage VOUT of the power converter 1 no longer undergoes a voltage drop, the discharge circuit 12 stops discharging the input voltage VIN and the process returns to S301.

Figure 4:
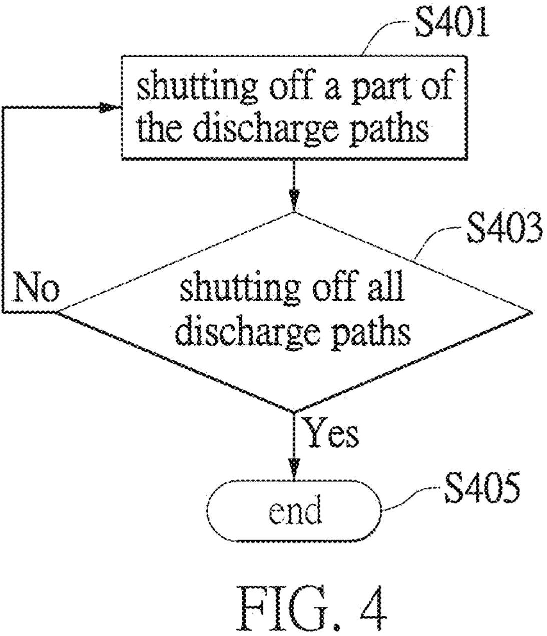
FIG. 4 is a control flowchart of the discharge circuit provided by an embodiment of the present disclosure.

Reference is made to FIG. 4, which is a control flowchart of the discharge circuit provided in an embodiment of the present disclosure. The process shown in FIG. 4 further explains S309 of FIG. 3.

In S401, a part of the discharge paths is shut off. When the discharge circuit 12 is shutting off, it can shut off all conducting discharge paths in stages, and shut off one or more conducting discharge paths each time to avoid another voltage overshoot in the input voltage VIN.

In S403, whether all discharge paths are shut off is determined. If the discharge circuit 12 determines that all discharge paths are shut off, the process proceeds to S405. If any conducting discharge paths have not yet been shut off, the process returns to S401.

In S405, the process ends.

Figure 5:
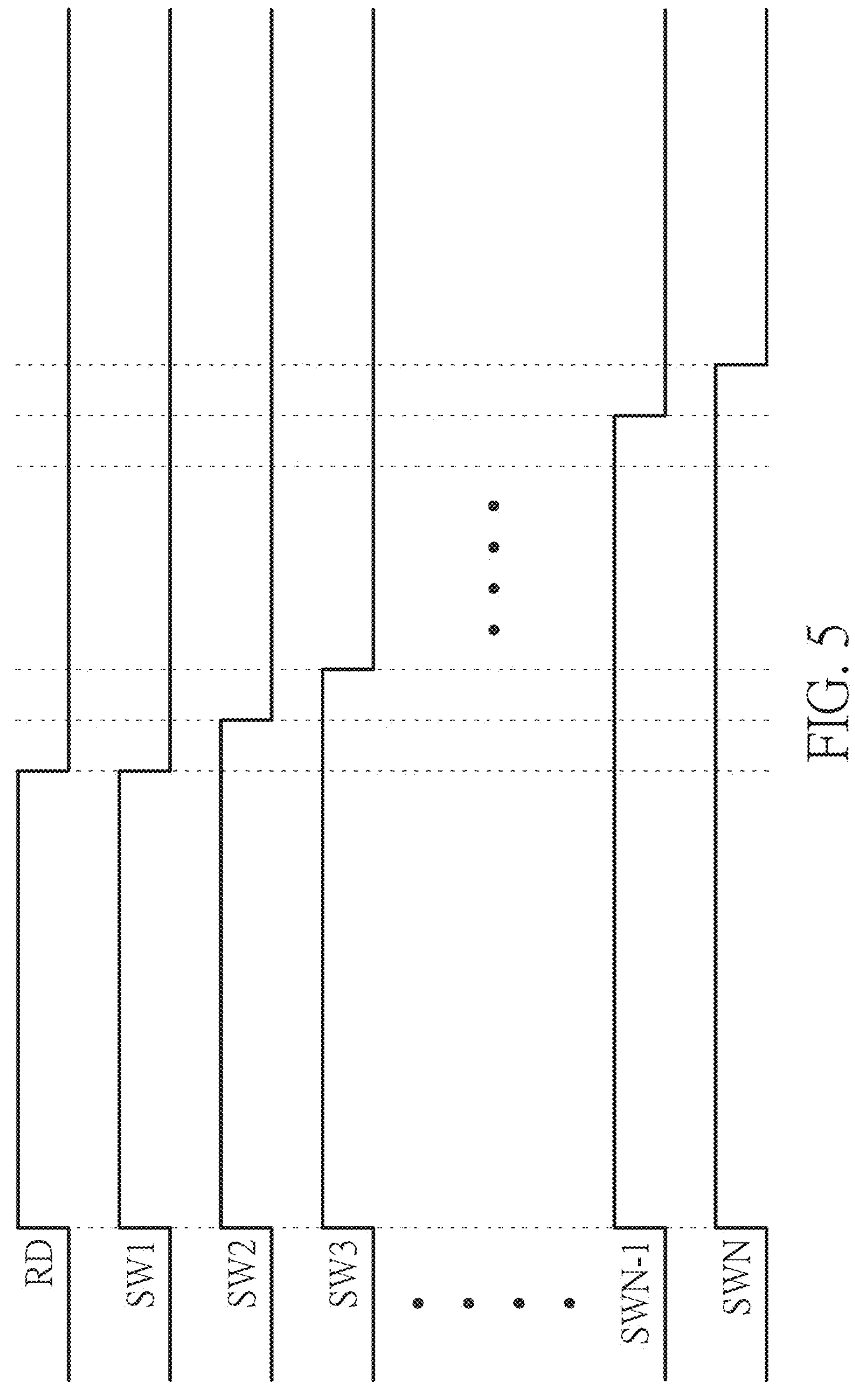
FIG. 5 is a waveform diagram of the discharge circuit provided by an embodiment of the present disclosure.
Figure 6:
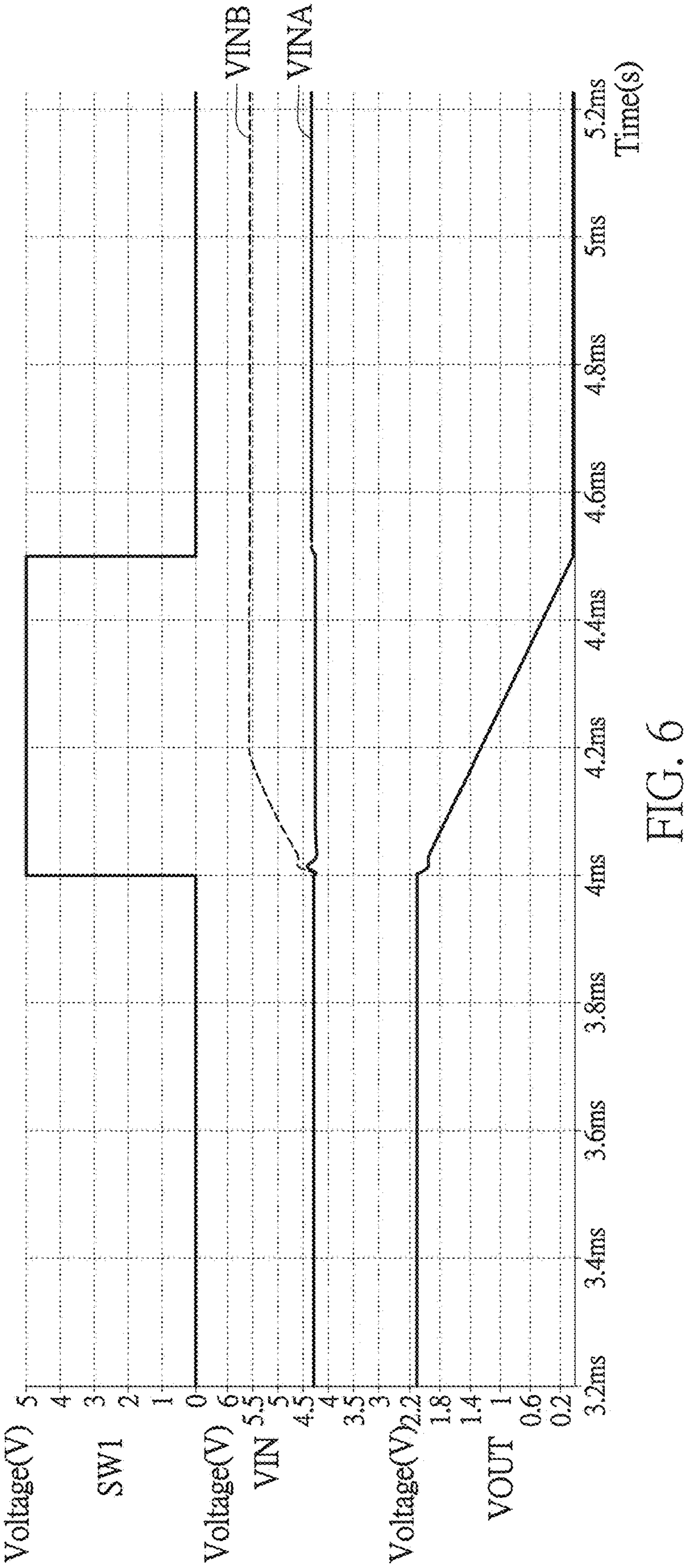
FIG. 6 is a voltage waveform diagram of the power converter provided by an embodiment of the present disclosure.

Reference is made to FIGS. 5 and 6. FIG. 5 is a control waveform diagram of the discharge circuit provided in an embodiment of the present disclosure. FIG. 6 is a voltage waveform diagram of the power converter provided in an embodiment of the present disclosure.

In FIG. 5, RD represents the output voltage drop signal. When RD is at a high level, it indicates that the output voltage VOUT is producing a voltage drop. When RD is at a low level, it indicates that the output voltage VOUT is not producing a voltage drop. The discharge circuit 12 controls whether to discharge the input voltage VIN based on the level of RD.

For example, in FIG. 6, the output voltage VOUT starts to produce a voltage drop at 4 ms, and at this time, RD in FIG. 5 switches to a high level. The discharge circuit 12 can then conduct all discharge paths simultaneously. As shown in FIG. 5, switching switches SW1, SW2 . . . SWN all conduct simultaneously, meaning that all discharge paths in the discharge circuit 12 can conduct simultaneously to discharge the input voltage VIN.

When the output voltage VOUT in FIG. 6 stops producing a voltage drop at around 4.5 ms, RD in FIG. 5 switches to a low level. The discharge circuit 12 can then shut off the conducting discharge paths in stages. For example, when RD switches from high to low, switching switch SW1 shuts off first, followed by switching switch SW2 after an interval, and so on, until the last switching switch SWN shuts off.

Additionally, FIG. 6 shows the waveform of the input voltage VINA through the surge suppression provided by the discharge circuit 12 in this embodiment. It is evident that when the output voltage VOUT starts to produce a voltage drop at 4 ms, the discharge circuit 12 can quickly start discharging, so that the input voltage VINA does not produce a surge. In contrast, the input voltage VINB of a traditional power converter is affected by the surge and undergoes voltage clamping protection after reaching the set value. Furthermore, when the output voltage VOUT stops producing a voltage drop at around 4.5 ms, the discharge circuit 12 uses the multiple-stop discharge mechanism shown in FIG. 5 to suppress the input voltage VINA from producing a surge.

Benefits of the Embodiments

The power converter with surge suppression provided by the present disclosure can quickly discharge the input voltage when the output voltage produces a voltage drop and stop discharging the input voltage when the output voltage stops producing a voltage drop, so as to ensure that the input voltage can effectively suppress surges during the process of starting and stopping the discharge, thereby ensuring the normal operation of electronic components in the power converter.

The foregoing description of the exemplary embodiments of the disclosure has been presented only for the purposes of illustration and description and is not intended to be exhaustive or to limit the disclosure to the precise forms disshut off. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A power converter with surge suppression, including:

a high-side switch, wherein a first end of the high-side switch is connected to an input voltage source to receive an input voltage from the input voltage source;

a low-side switch, wherein a first end of the low-side switch is connected to a second end of the high-side switch, a second end of the low-side switch is grounded, a node between the first end of the low-side switch and the second end of the high-side switch is connected to a first end of an inductor, a second end of the inductor is connected to a first end of one or more output capacitors, a second end of the one or more output capacitors is grounded, and a node between the second end of the inductor and the first end of the one or more output capacitors serves as the output end of the power converter;

a control circuit, connected to a control end of the high-side switch and a control end of the low-side switch and configured to control operation of the high-side switch and the low-side switch; and a discharge circuit, configured to receive an output voltage drop signal from an external ramp indication circuit, and in response to the output voltage drop signal indicating that an output voltage of an output voltage signal at the output end of the power converter is dropping, discharging the input voltage source, and in response to the output voltage drop signal indicating that the output voltage stops dropping, stopping the discharging of the input voltage source.

2. The power converter according to claim 1, wherein, when the discharge circuit discharges the input voltage source, a plurality of discharge paths are provided to simultaneously conduct and discharge the input voltage source.

3. The power converter according to claim 2, wherein, when the discharge circuit stops discharging the input voltage source, the plurality of discharge paths that are simultaneously conducting are shut off in stages until all of the plurality of discharge paths are shut off.

4. The power converter according to claim 2, wherein the discharge circuit further includes a switch control circuit and a plurality of switching switches, the switch control circuit is connected to the plurality of switching switches, each of the plurality of switching switches corresponds to one discharge path, and the switch control circuit controls the plurality of switching switches to be turned on or off according to the output voltage drop signal.

5. The power converter according to claim 4, wherein, when the switch control circuit receives the output voltage drop signal indicating that the output voltage is dropping, the switch control circuit controls the plurality of switching switches to turn on simultaneously for allowing the input voltage source to discharge through the plurality of discharge paths.

6. The power converter according to claim 4, wherein, when the switch control circuit receives the output voltage drop signal indicating that the output voltage stops dropping, the switch control circuit controls the plurality of switching switches to shut off in stages, and stops discharging the input voltage source when all of the plurality of switching switches are shut off.

7. The power converter according to claim 6, wherein the switch control circuit controls the plurality of switching switches to shut off in stages by turning on at least one switching switch each time.

8. The power converter according to claim 4, wherein, when the switch control circuit receives the output voltage drop signal indicating that the output voltage stops dropping, the switch control circuit outputs a shut-off command to one of the plurality of the switching switches that is turned on, and after an interval outputs the shut-off command to another of the plurality of the switching switches that is turned on until all conducting switching switches receive the shut-off command, and the switching switch that is turned on switches from conducting to turn on upon receiving the shut-off command.

9. The power converter according to claim 4, wherein, when the switch control circuit receives the output voltage drop signal indicating that the output voltage stops dropping, the switch control circuit controls all the plurality of switching switches to shut off within a preset time range, and during the preset time range, shuts off at least one of the plurality of switching switches in stages.

10. The power converter according to claim 1, further including a clamp circuit, wherein the clamp circuit is connected to the input voltage source and activated to clamp the input voltage to a first voltage threshold when the input voltage of the input voltage source is greater than the first voltage threshold of the clamp circuit.

11. The power converter according to claim 10, wherein, when the discharge circuit discharges the input voltage source, the discharge circuit clamps the input voltage to a second voltage threshold, and the first voltage threshold is greater than the second voltage threshold.

12. The power converter according to claim 1, further including a bootstrap capacitor, wherein a first end of the bootstrap capacitor is coupled to a power voltage, and a second end of the bootstrap capacitor is connected to the second end of the high-side switch.

13. The power converter according to claim 12, further including a diode, wherein an anode of the diode is coupled to the power voltage, and a cathode of the diode is connected to the first end of the bootstrap capacitor.

14. The power converter according to claim 1, further including a high-side buffer, wherein the high-side buffer is a buffer, an input end of the high-side buffer is connected to an output end of the control circuit, and an output end of the high-side buffer is connected to the control end of the high-side switch.

15. The power converter according to claim 1, further including a low-side buffer, wherein the low-side buffer is a buffer, an input end of the low-side buffer is connected to an output end of the control circuit, and an output end of the low-side buffer is connected to the control end of the low-side switch.

* * * * *